(12) United States Patent
Wei et al.

(10) Patent No.: US 12,471,484 B2
(45) Date of Patent: Nov. 11, 2025

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Feng Wei, Shenzhen (CN); Jinchuan Li, Shenzhen (CN)

(73) Assignee: SHENZHEN CHINA STAR OPTOELECTRONICS SEMICONDUCTOR DISPLAY TECHNOLOGY CO., LTD., Shezhen (CN)

( * ) Notice: Subject to any disclaimer, the term of this patent is extended or adjusted under 35 U.S.C. 154(b) by 451 days.

(21) Appl. No.: 16/625,778

(22) PCT Filed: Dec. 13, 2019

(86) PCT No.: PCT/CN2019/125159
§ 371 (c)(1),
(2) Date: Jun. 15, 2022

(87) PCT Pub. No.: WO2021/109210
PCT Pub. Date: Jun. 10, 2021

(65) Prior Publication Data
US 2022/0310739 A1    Sep. 29, 2022

(30) Foreign Application Priority Data

Dec. 4, 2019  (CN) .......................... 201911224528.6

(51) Int. Cl.
*H10K 71/40* (2023.01)
*H10K 50/84* (2023.01)
(Continued)

(52) U.S. Cl.
CPC ....... *H10K 59/874* (2023.02); *H10K 50/8426* (2023.02); *H10K 50/846* (2023.02);
(Continued)

(58) Field of Classification Search
CPC ............... H10K 59/874; H10K 59/131; H10K 59/8722; H10K 50/846; H10K 71/00; H10K 59/873; H10K 71/40; H10K 50/8426
See application file for complete search history.

(56) References Cited

U.S. PATENT DOCUMENTS 11,196,025 B2 * 12/2021 Wang ................. H10K 59/8731
2003/0122476 A1   7/2003 Wang et al.
(Continued)

FOREIGN PATENT DOCUMENTS

CN     104505465    * 12/2014
CN     104505465 A    4/2015
(Continued)

*Primary Examiner* — Jay C Kim
*Assistant Examiner* — Joshua Scott Wyatt
(74) *Attorney, Agent, or Firm* — PV IP PC; Wei Te Chung

(57) ABSTRACT

A display panel and a manufacturing method thereof are provided. The display panel includes a substrate; a light-emitting functional layer disposed on the substrate; a thin-film encapsulation layer disposed on the substrate and the light-emitting functional layer and covering the light-emitting functional layer; a drying layer disposed on the substrate and disposed around the thin-film encapsulation layer; an encapsulation cover plate disposed on the drying layer and the thin-film encapsulation layer; a curing adhesive layer disposed between the substrate and the encapsulation cover plate and disposed around the drying layer, the curing adhesive layer configured to fix the substrate and the encapsulation cover plate, and a ring-shaped groove disposed around the drying layer and provided between the drying (Continued)

layer and the curing adhesive layer; and an encapsulant layer disposed in the ring-shaped groove.

16 Claims, 4 Drawing Sheets

(51) Int. Cl.
  *H10K 50/842* (2023.01)
  *H10K 59/131* (2023.01)
  *H10K 59/80* (2023.01)
  *H10K 71/00* (2023.01)

(52) U.S. Cl.
  CPC ....... *H10K 59/131* (2023.02); *H10K 59/8722* (2023.02); *H10K 59/873* (2023.02); *H10K 71/00* (2023.02); *H10K 71/40* (2023.02)

(56) References Cited

U.S. PATENT DOCUMENTS

| | | |
|---|---|---|
| 2012/0153333 A1 | 6/2012 | Yamazaki et al. |
| 2014/0252325 A1 | 9/2014 | Kim et al. |
| 2016/0087243 A1 | 3/2016 | Senoo et al. |
| 2017/0133625 A1 | 5/2017 | Li |
| 2017/0133626 A1 | 5/2017 | Senoo et al. |

FOREIGN PATENT DOCUMENTS

| | | | | |
|---|---|---|---|---|
| CN | 104882556 A | | 9/2015 | |
| CN | 105679961 | * | 1/2016 | |
| CN | 105679961 A | | 6/2016 | |
| CN | 106489301 A | | 3/2017 | |
| CN | 109713165 | * | 5/2019 | |
| CN | 109713165 A | | 5/2019 | |
| CN | 109994642 A | | 7/2019 | |
| JP | 4177578 B2 | * | 11/2008 | |
| KR | 20160038178 A | * | 4/2016 | ........... H10K 50/844 |

* cited by examiner

S10: providing a substrate, and forming a light-emitting functional layer on the substrate;

S20: forming a thin-film encapsulation layer on the substrate and the light-emitting functional layer, covering the light-emitting functional layer S30: providing an encapsulation cover plate, and forming a drying layer and a curing adhesive layer on the encapsulation cover plate, wherein the drying layer includes an opening for accommodating the thin-film encapsulation layer, the curing adhesive layer is disposed around the drying layer, and a ring-shaped groove disposed around the drying layer is formed between the drying layer and the curing adhesive layer;

S40: bonding the substrate with the encapsulation cover plate so that the thin-film encapsulation layer is located in the opening, and fixing the substrate and the encapsulation cover plate by the curing adhesive layer; and S50: forming an encapsulant in the ring-shaped groove.

FIG. 5

DISPLAY PANEL AND MANUFACTURING METHOD THEREOF

BACKGROUND OF INVENTION

Field of Invention

The present application relates to a field of display panel technologies, and in particular, to a display panel and a manufacturing method thereof.

Description of Prior Art

An organic light emitting diode (OLED) display is a new generation of display. Compared with a liquid crystal display, it has many advantages such as self-light-emitting, fast response times, wide viewing angles, and color saturation. However, the OLED device is sensitive to water and oxygen in the air, thus easily absorbing water and oxidized, which causes a decrease in service life of the OLED device or failure of a pixel. Therefore, it is important to effectively package the OLED device to fully isolate the OLED device from water and oxygen and extend the service life of the OLED device.

With development of OLED display technology, the existing single OLED package structure can no longer meet multiple requirements of the OLED device for water-oxygen barrier and package structure strength.

SUMMARY OF INVENTION

Embodiments of the present application provide a display panel and a manufacturing method thereof to solve the problems that the existing package structure fails to have both water-oxygen barrier and high package structure strength.

An embodiment of the present application provides a display panel, including:
 a substrate;
 a light-emitting functional layer disposed on the substrate;
 a thin-film encapsulation layer disposed on the substrate and the light-emitting functional layer and covering the light-emitting functional layer;
 a drying layer disposed on the substrate and disposed around the thin-film encapsulation layer;
 an encapsulation cover plate disposed on the drying layer and the thin-film encapsulation layer;
 a curing adhesive layer disposed between the substrate and the encapsulation cover plate and disposed around the drying layer, the curing adhesive layer configured to fix the substrate and the encapsulation cover plate, and a ring-shaped groove disposed around the drying layer and provided between the drying layer and the curing adhesive layer; and
 an encapsulant layer disposed in the ring-shaped groove.

In the display panel according to an embodiment of the present application, the display panel further includes a transparent filling layer adjacent to the drying layer, wherein the transparent filling layer is provided between the thin-film encapsulation layer and the encapsulation cover plate.

In the display panel according to an embodiment of the present application, the transparent filling layer is made of a resin material.

In the display panel according to an embodiment of the present application, the encapsulant layer has a ring shape and is filled in the ring-shaped groove and disposed around the drying layer.

In the display panel according to an embodiment of the present application, the encapsulant layer includes a plurality of encapsulant blocks, which are disposed in the ring-shaped groove at intervals.

In the display panel according to an embodiment of the present application, the encapsulation cover plate is provided with a plurality of printing holes communicating with the ring-shaped groove, and the printing holes are disposed above the ring-shaped groove at intervals, around an area corresponding to the thin-film encapsulation layer and the drying layer.

In the display panel according to an embodiment of the present application, each of the printing holes has a diameter of 0.2 mm to 1 mm.

In the display panel according to an embodiment of the present application, the drying layer is made of a mixture of resin and barium carbonate or a mixture of resin and calcium carbonate.

In the display panel according to an embodiment of the present application, the encapsulant layer is made of glass adhesive.

According to the above purpose of the present application, a method of manufacturing a display panel is further provided, including the following steps:
 providing a substrate, and forming a light-emitting functional layer om the substrate;
 forming a thin-film encapsulation layer on the substrate and the light-emitting functional layer, covering the light-emitting functional layer;
 providing an encapsulation cover plate, and forming a drying layer and a curing adhesive layer on the encapsulation cover plate, wherein the drying layer includes an opening for accommodating the thin-film encapsulation layer, the curing adhesive layer is disposed around the drying layer, and a ring-shaped groove disposed around the drying layer is formed between the drying layer and the curing adhesive layer;
 bonding the substrate with the encapsulation cover plate so that the thin-film encapsulation layer is located in the opening, and fixing the substrate and the encapsulation cover plate by the curing adhesive layer; and
 forming an encapsulant layer in the ring-shaped groove.

In the method of manufacturing the display panel according to an embodiment of the present application, the step of the forming an encapsulant layer in the ring-shaped groove includes:
 forming a plurality of printing holes communicating with the ring-shaped groove on the encapsulation cover plate, wherein the printing holes are disposed above the ring-shaped groove at intervals, around an area corresponding to the thin-film encapsulation layer and the drying layer; and
 inkjet printing an encapsulant in the ring-shaped groove through the printing holes, followed by curing to form the encapsulant layer.

In the method of manufacturing the display panel according to an embodiment of the present application, the plurality of printing holes communicating with the ring-shaped groove are formed on the encapsulation cover plate by laser drilling.

In the method of manufacturing the display panel according to an embodiment of the present application, the method of manufacturing the display panel, before the step of bonding the substrate with the encapsulation cover plate, further includes:
 forming a transparent filling layer on the thin-film encapsulation layer.

In the method of manufacturing the display panel according to an embodiment of the present application, the transparent filling layer is formed on the thin-film encapsulation layer by inkjet printing or coating.

In the method of manufacturing the display panel according to an embodiment of the present application, the light-emitting functional layer is formed on the substrate by vacuum evaporation coating or inkjet printing.

In the method of manufacturing the display panel according to an embodiment of the present application, the thin-film encapsulation layer covering the light-emitting functional layer is formed on the substrate and the light-emitting functional layer by chemical vapor deposition.

A display panel and a manufacturing method thereof provided in the embodiments of the present application realize hybrid packaging of the light-emitting functional layer by combining a structure of the encapsulation cover plate and the glass adhesive with a structure of the thin film encapsulation layer, the drying layer, and the curing adhesive layer, such that not only good water-oxygen barrier properties can be ensured, but also good packaging strength is provided; and in addition, by forming an encapsulant layer between the drying layer and the curing adhesive layer, a dimension of a passage of water vapor into the display panel can be effectively controlled, which can be adapted to the packaging of OLED display panels of different sizes.

BRIEF DESCRIPTION OF DRAWINGS

The following detailed description of specific embodiments of the present application will make the technical solutions and other beneficial effects of the present application obvious in conjunction with the drawings.

FIG. 5 is a schematic flowchart of a method of manufacturing a display panel according to an embodiment of the present application.

DETAILED DESCRIPTION OF PREFERRED EMBODIMENTS

Figure 1:
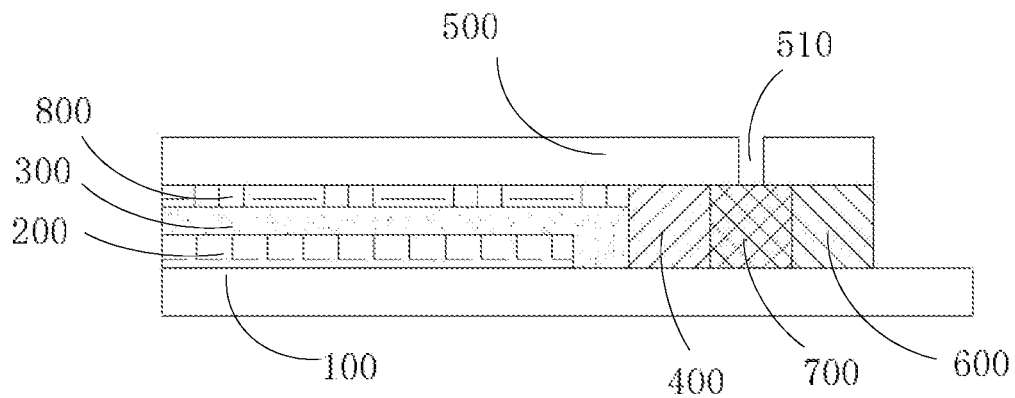
FIG. 1 is a schematic structural diagram of a display panel according to an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", etc. demonstrating the orientation or positional relationship of the indications is based on the orientation shown in the drawings Or, the positional relationship is merely for the convenience of the description of the present invention and the simplification of the description, and is not intended to imply that the device or the component of the present invention has a specific orientation and is constructed and operated in a specific orientation, thus being not to be construed as limiting the present invention. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly. In the description of the present invention, the meaning of "a plurality" is two or more unless specifically defined otherwise.

In the description of the present invention, it should be noted that the terms "installation", "connection", and "bonding" are to be understood broadly unless otherwise explicitly defined and limited. For example, it may be fixed connection, detachable connection, or integrally connection; being mechanical or electrical connection; also, being directly connection, indirectly connection through an intermediate medium, or internal communication of two components. The specific meaning of the above terms in the present invention can be understood in a specific case by those skilled in the art.

The following disclosure provides many different embodiments, or examples, for implementing different features of the invention. Specific examples of components and arrangements are described below to simplify the present disclosure. These are, of course, merely examples and are not intended to be limiting.

The following disclosure provides many different embodiments or examples for implementing different structures of the present invention. In order to simplify the disclosure of the present invention, the components and arrangements of the specific examples are described below. Of course, they are merely examples and are not intended to limit the present invention. In addition, the present invention may repeat reference numerals and/or reference letters in the various embodiments, which are for the purpose of simplicity and clarity, and do not indicate the relationship between the various embodiments and/or arrangements discussed. Moreover, the present invention provides examples of various specific processes and materials, but one of ordinary skill in the art will recognize the use of other processes and/or the use of other materials.

Specifically, referring to FIG. 1 to FIG. 4, an embodiment of the present application provides a display panel including:

a substrate 100;

a light-emitting functional layer 200 disposed on the substrate 100;

a thin-film encapsulation layer 300 disposed on the substrate 100 and the light-emitting functional layer 200 and covering the light-emitting functional layer 200;

a drying layer 400 disposed on the substrate 100 and disposed around the thin-film encapsulation layer 300;

an encapsulation cover plate 500 disposed on the drying layer 400 and the thin-film encapsulation layer 300;

a curing adhesive layer 600 disposed between the substrate 100 and the encapsulation cover plate 500 and disposed around the drying layer 400, the curing adhesive layer 600 configured to fix the substrate 100 and the encapsulation cover plate 500, and a ring-shaped groove 10 disposed around the drying layer 400 and provided between the drying layer 400 and the curing adhesive layer 600; and an encapsulant layer 700 disposed in the ring-shaped groove 10.

It can be understood that the substrate 100 may be a substrate 100 with a TFT functional layer, and the light emitting functional layer 200 may include functional layers such as an anode layer, an electron blocking layer, a light emitting layer, a hole blocking layer, an electron transport layer, an electron injection layer, and a cathode layer, which are sequentially stacked on the substrate 100, wherein the thin film encapsulation layer 300 may be a structure in which an organic layer and an inorganic layer are alternately stacked, and may be made of SiO, SiON, SiN, etc. Specifically, a material of the drying layer 400 may be a resin mixed with barium carbonate or calcium carbonate, which has a certain water absorption and drying performance. The encapsulant layer 700 is made of a glass adhesive, and the curing adhesive layer 600 is made of an UV adhesive; such that, overall, a composite package of structures of the thin film encapsulation layer 300, the encapsulation cover plate 500, the drying layer 400, and the encapsulation layer 700 is used to enhance reliability of the package and increase the service life of the display panel.

In an embodiment, a transparent filling layer 800 adjacent to the drying layer 400 is further included, and the transparent filling layer 800 is disposed between the thin film encapsulation layer 300 and the encapsulation cover plate 500. Obviously, the transparent filling layer 800 is provided between the thin film encapsulation layer 300 and the encapsulation cover plate 500 to play a certain buffering effect. Specifically, the transparent filling layer 800 may be made of a resin material.

Figure 2:
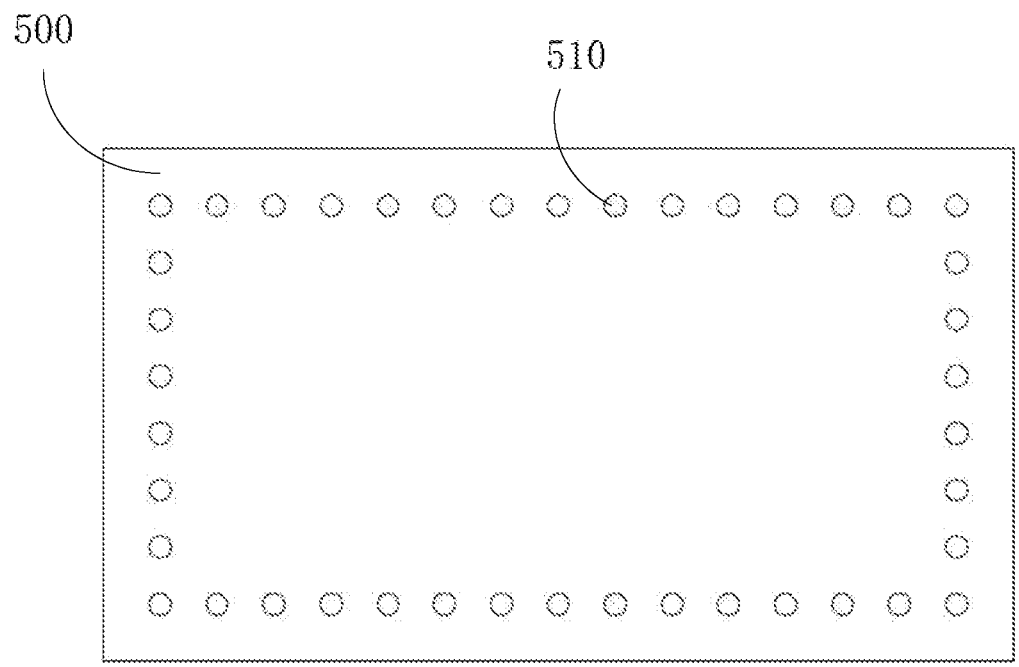
FIG. 2 is a side view of an encapsulation cover plate in a display panel according to an embodiment of the present application.

In an embodiment, as shown in FIG. 2, the encapsulation cover plate 500 is provided with a plurality of printing holes 510 communicating with the ring-shaped groove 10, and the printing holes 510 are disposed above the ring-shaped groove 10 at intervals, around an area corresponding to the thin-film encapsulation layer 300 and the drying layer 400. It is worth noting that the printing holes 510 are configured to subsequently print the encapsulant layer 700 into the ring-shaped groove 10. For example, on a premise of using inkjet printing, a size of each of the printing holes 510 must be larger than a size of the inkjet printing head in order to facilitate normal printing. Specifically, a distance between any adjacent ones of the printing holes 510 is equal, and each of the printing holes 510 has a diameter of 0.2 mm to 1 mm.

Figure 3:
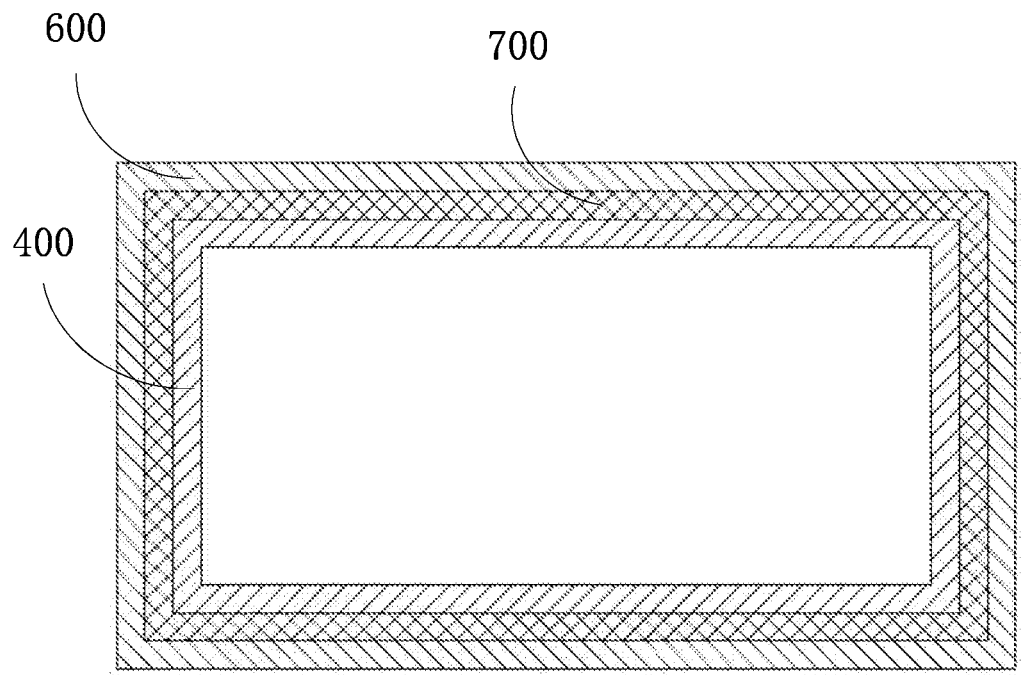
FIG. 3 is a top view of an encapsulant layer according to an embodiment of the present application.

In an embodiment, as shown in FIG. 3, the encapsulant layer 700 has a ring shape and is filled in the ring-shaped groove 10 and disposed around the drying layer 400. Obviously, when a distance between adjacent ones of the printing holes 510 is relatively small, the encapsulant layer 700 is easily connected to be integrated into one piece in the ring-shaped groove 10, so that the encapsulant layer 700 is completely filled in the ring-shaped groove 10, and an entire space of the ring-shaped groove 10 is completely sealed.

Figure 4:
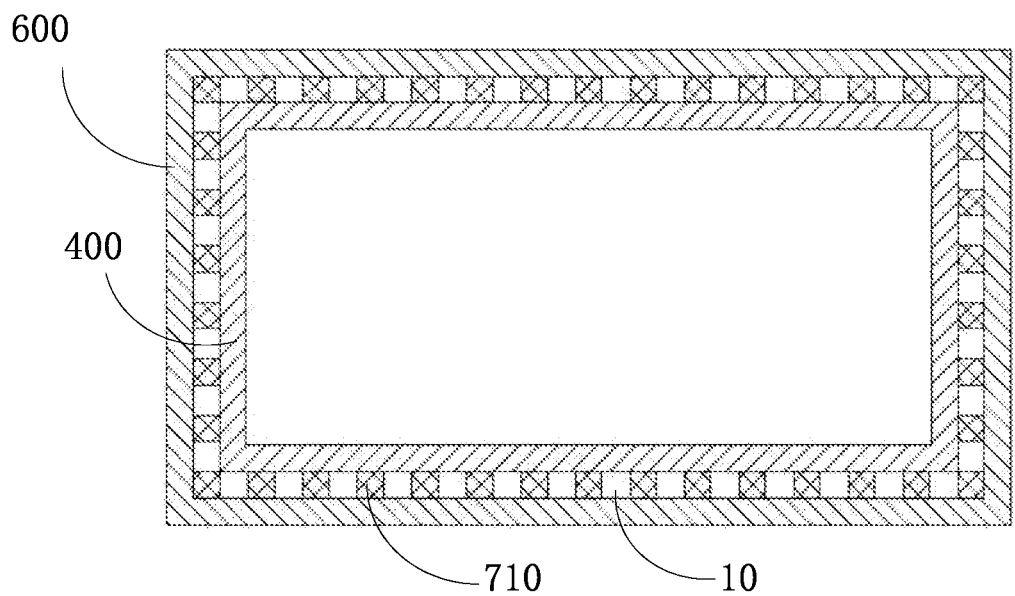
FIG. 4 is a plan view of an encapsulation layer according to another embodiment of the present application.

In an embodiment, as shown in FIG. 4, the encapsulating rubber layer 700 includes a plurality of encapsulant blocks 710, which are disposed in the ring-shaped groove 10 at intervals. It can be understood that, in this case, the distance between adjacent ones of the printing holes 510 is relatively large, and the encapsulant layer 700 cannot be integrated into one piece in the ring-shaped groove 10 by printing, and thus forming a plurality of encapsulant blocks 710 in one-to-one correspondence with the printing holes 510, and each of the printing holes 510 is printed with one of the encapsulant blocks 710 for sealing.

It can be understood that a width of the encapsulant layer 700 is determined by a width of the ring-shaped groove 10, and the width of the encapsulant layer 700 can be controlled by controlling the distance between the drying layer 400 and the curing adhesive layer 600, and can be adjusted according to a size of a panel to be packaged, to provide a better adaptability to the packages of panels of different types. Specifically, the width of the ring-shaped groove 10 ranges from 0.3 mm to 0.8 mm.

Figure 6:
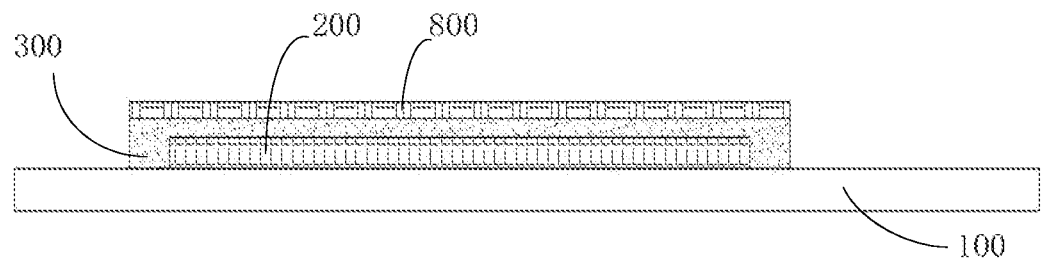
FIG. 6 to FIG. 9 are structural process diagrams of a method of manufacturing a display panel according to an embodiment of the present application.
Figure 7:
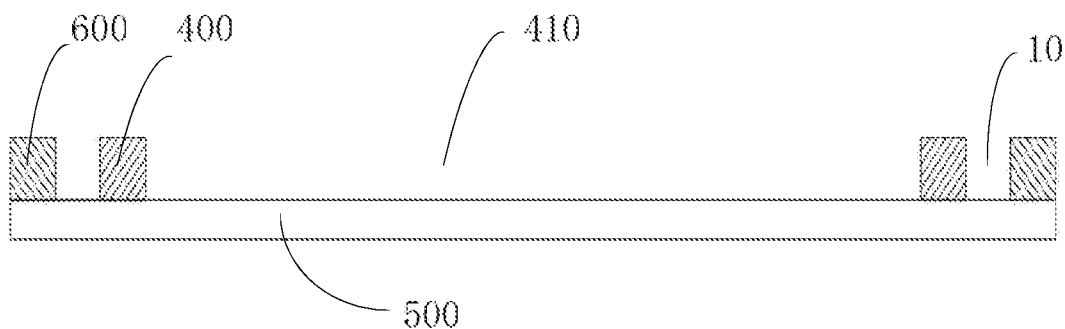
Figure 8:
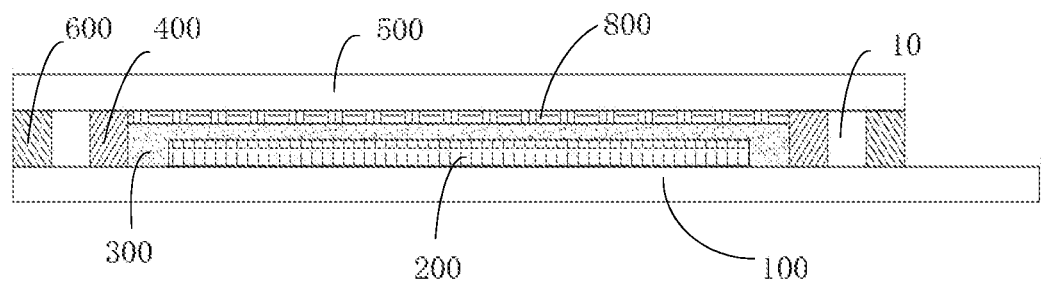
Figure 9:
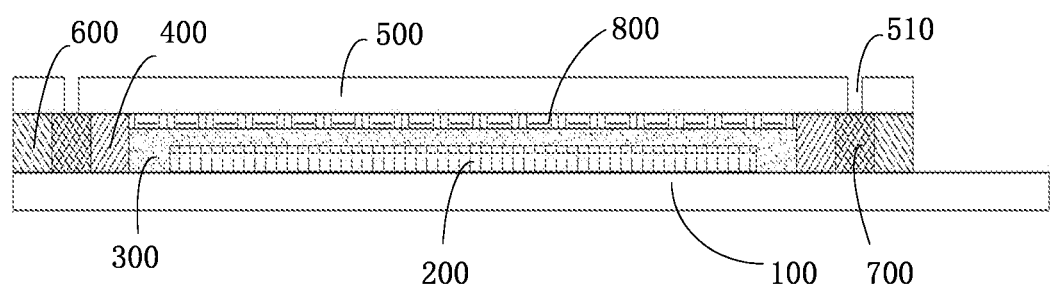

According to the above purpose of the present application, a method of manufacturing a display panel is also provided. As shown in FIG. 5, the method includes the following steps:

Step S10: providing a substrate 100, and forming a light-emitting functional layer 200 on the substrate 100, as shown in FIG. 6;

Step S20: forming a thin-film encapsulation layer 300 on the substrate 100 and the light-emitting functional layer 200, covering the light-emitting functional layer 200, wherein specifically, the light-emitting functional layer 200 may be formed by vacuum evaporation or inkjet printing, and meanwhile, the thin film encapsulation layer 300 may be formed by chemical vapor deposition;

Step S30: providing an encapsulation cover plate 500, and forming a drying layer 400 and a curing adhesive layer 600 on the encapsulation cover plate 500, wherein the drying layer 400 includes an opening 410 for accommodating the thin-film encapsulation layer 300, the curing adhesive layer 600 is disposed around the drying layer 400, and a ring-shaped groove 10 disposed around the drying layer 400 is formed between the drying layer 400 and the curing adhesive layer 600, as shown in FIG. 7, wherein specifically, the drying layer 400 and the curing adhesive layer 600 may be formed by inkjet printing or coating;

Step S40: bonding the substrate 100 with the encapsulation cover plate 500 so that the thin-film encapsulation layer 300 is located in the opening 410, and fixing the substrate 100 and the encapsulation cover plate 500 by the curing adhesive layer 600, as shown in FIG. 8; and Step S50: forming an encapsulant 700 in the ring-shaped groove 10, as shown in FIG. 9.

The curing adhesive layer 600 is made of an UV adhesive, and the UV adhesive can be cured by light to fix the substrate 100 and the encapsulation cover plate 500.

In an embodiment, in step S50, the step of forming the encapsulant layer 700 in the ring-shaped groove 10 includes:

forming a plurality of printing holes 510 communicating with the ring-shaped groove 10 on the encapsulation cover plate 500, wherein the printing holes 510 are disposed above the ring-shaped groove 10 at intervals, around an area corresponding to the thin-film encapsulation layer 300 and the drying layer 400; and inkjet printing an encapsulant in the ring-shaped groove 10 through the printing holes 510, followed by curing to form the encapsulant layer 700, wherein, the encapsulant is glass adhesive, and specifically, the encapsulant layer 700 may be formed by laser curing.

In an embodiment, the plurality of printing holes 510 communicating with the ring-shaped groove 10 are formed on the encapsulation cover plate 500 by laser drilling.

In an embodiment, as shown in FIG. 6, before the step of bonding the substrate 100 with the encapsulation cover plate 500, the step S20 further includes:

forming a transparent filling layer 800 on the thin-film encapsulation layer 300. Specifically, the transparent filling layer 800 can be formed on the thin film encapsulation layer 300 by inkjet printing or coating.

In summary, the method of manufacturing the display panel provided by the present application can control a distance between the curing adhesive layer 600 and the drying layer 400 during preparing the curing adhesive layer 600 and the drying layer 400, thereby controlling the width of the ring-shaped groove 10 to limit the width of the encapsulant layer 700 and to adapt to packaging of panels of different sizes. In addition, by providing printing holes 510 on the encapsulating cover plate 500, and employing the process of printing the encapsulant layer 700 for packaging, the number and density of the printing holes 510 can be adjusted according to different needs, and the overall manufacturing process is mature and suitable for mass production.

In summary, a display panel and a manufacturing method thereof provided in the embodiments of the present application realize hybrid packaging of the light-emitting functional layer 200 by combining a structure of the encapsulation cover plate 500 and the glass adhesive with a structure of the thin film encapsulation layer 300, the drying layer 400, and the curing adhesive layer 600, such that not only good water-oxygen barrier properties can be ensured, but also good packaging strength is provided; and in addition, by forming an encapsulant layer 700 between the drying layer 400 and the curing adhesive layer 600, a dimension of a passage of water vapor into the display panel can be effectively controlled, which can be adapted to the packaging of OLED display panels of different sizes.

It can be understood that for a person of ordinary skill in the art, equivalent replacements or changes can be made according to the technical solution of the present application and its inventive concept, and all these changes or replacements should fall within the protection scope of the claims attached to the present application.

What is claimed is:

1. A display panel, comprising:
   a substrate;
   a light-emitting functional layer disposed on the substrate;
   a thin-film encapsulation layer disposed on the substrate to cover the light-emitting functional layer;
   a drying layer disposed on the substrate to surround the thin-film encapsulation layer;
   an encapsulation cover plate disposed on the drying layer and the thin-film encapsulation layer;
   a curing adhesive layer disposed between the substrate and the encapsulation cover plate to fix the substrate and the encapsulation cover plate, wherein the curing adhesive layer is disposed to surround the drying layer and an orthographic projection of the curing adhesive layer on the substrate is spaced apart from an orthographic projection of the drying layer on the substrate, so that a ring-shaped groove is formed between the drying layer and the curing adhesive layer; and
   an encapsulation adhesive layer disposed in the ring-shaped groove,
   wherein the curing adhesive layer comprises an ultraviolet curing adhesive, and the encapsulation adhesive layer comprises an adhesive different from the ultraviolet curing adhesive.

2. The display panel according to claim 1, further comprising a transparent filling layer adjacent to the drying layer, wherein the transparent filling layer is disposed between the thin-film encapsulation layer and the encapsulation cover plate.

3. The display panel according to claim 2, wherein the transparent filling layer is made of a resin material.

4. The display panel according to claim 1, wherein the encapsulation adhesive layer has a ring shape and is filled in the ring-shaped groove to surround the drying layer.

5. The display panel according to claim 1, wherein the encapsulation adhesive layer comprises a plurality of encapsulation adhesive blocks arranged at intervals in the ring-shaped groove.

6. The display panel according to claim 1, wherein the encapsulation cover plate is provided with a plurality of printing holes each connected to the ring-shaped groove, and the printing holes are arranged at intervals above the ring-shaped groove.

7. The display panel according to claim 6, wherein each of the printing holes has a diameter of 0.2 mm to 1 mm.

8. The display panel according to claim 1, wherein the drying layer is made of a mixture of resin and barium carbonate or a mixture of resin and calcium carbonate.

9. The display panel according to claim 1, wherein the encapsulation adhesive layer is made of glass adhesive.

10. A method of manufacturing a display panel, comprising:
    providing a substrate, and forming a light-emitting functional layer on the substrate;
    forming a thin-film encapsulation layer on the substrate to cover the light-emitting functional layer;
    providing an encapsulation cover plate, and forming a drying layer and a curing adhesive layer on the encapsulation cover plate, wherein a space for accommodating the thin-film encapsulation layer is formed by the encapsulation cover plate and the drying layer, and the curing adhesive layer is disposed to surround the drying layer so that a ring-shaped groove is formed between the drying layer and the curing adhesive layer;
    bonding the substrate to the encapsulation cover plate so that the thin-film encapsulation layer is accommodated in the space and surrounded by the drying layer, the curing adhesive layer is disposed between the substrate and the encapsulation cover plate to fix the substrate and the encapsulation cover plate, and an orthographic projection of the curing adhesive layer on the substrate is spaced apart from an orthographic projection of the drying layer on the substrate; and
    forming an encapsulation adhesive layer in the ring-shaped groove,
    wherein the curing adhesive layer comprises an ultraviolet curing adhesive, and the encapsulation adhesive layer comprises an adhesive different from the ultraviolet curing adhesive.

11. The method of manufacturing the display panel according to claim 10, wherein the forming of the encapsulation adhesive layer in the ring-shaped groove comprises:
    forming a plurality of printing holes each connected to the ring-shaped groove in the encapsulation cover plate, wherein the printing holes are arranged at intervals above the ring-shaped groove; and
    forming the encapsulation adhesive layer by inkjet printing an encapsulation adhesive in the ring-shaped groove through the printing holes and curing the printed encapsulation adhesive.

12. The method of manufacturing the display panel according to claim 11, wherein the plurality of printing holes are formed in the encapsulation cover plate by laser drilling.

13. The method of manufacturing the display panel according to claim 10, further comprising: before bonding the substrate to the encapsulation cover plate, forming a transparent filling layer on the thin-film encapsulation layer.

14. The method of manufacturing the display panel according to claim 13, wherein the transparent filling layer is formed on the thin-film encapsulation layer by inkjet printing or coating.

15. The method of manufacturing the display panel according to claim 10, wherein the light-emitting functional layer is formed on the substrate by vacuum evaporation coating or inkjet printing.

16. The method of manufacturing the display panel according to claim 10, wherein the thin-film encapsulation layer covering the light-emitting functional layer is formed on the substrate by chemical vapor deposition.

* * * * *